(12) United States Patent
Chen et al.

(10) Patent No.: US 11,189,510 B2
(45) Date of Patent: Nov. 30, 2021

(54) ADAPTIVE INSET FOR WAFER CASSETTE SYSTEM

(71) Applicant: Taiwan Semiconductor Manufacturing Co., Ltd., Hsin-Chu (TW)

(72) Inventors: Chia-Yuan Chen, Hsinchu (TW); Hung-Jen Lu, Hsinchu (TW); Ming-Hsien Lee, Zhubei (TW); Po-Tao Chu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/655,503

(22) Filed: Oct. 17, 2019

(65) Prior Publication Data

US 2020/0051842 A1 Feb. 13, 2020

Related U.S. Application Data

(63) Continuation of application No. 15/288,155, filed on Oct. 7, 2016, now Pat. No. 10,535,541.
(Continued)

(51) Int. Cl.
*H01L 21/673* (2006.01)

(52) U.S. Cl.
CPC .............................. *H01L 21/67386* (2013.01)

(58) Field of Classification Search
CPC ......... H01L 21/67353; H01L 21/67356; H01L 21/67383; H01L 21/67359; H01L 21/67363
See application file for complete search history.

(56) References Cited

U.S. PATENT DOCUMENTS

| 5,570,987 A | * | 11/1996 | McKenna | ......... | H01L 21/67373 |
| | | | | | 414/416.01 |
| 6,341,703 B1 | | 1/2002 | Wu | | |

(Continued)

FOREIGN PATENT DOCUMENTS

| CN | 201117640 Y | 9/2008 |
| CN | 103575075 A | 2/2014 |

(Continued)

OTHER PUBLICATIONS

Non-Final Office Action dated Oct. 1, 2018 in connection with U.S. Appl. No. 15/288,155.

(Continued)

*Primary Examiner* — Saul Rodriguez
*Assistant Examiner* — Willie Berry, Jr.
(74) *Attorney, Agent, or Firm* — Eschweiler & Potashnik, LLC

(57) ABSTRACT

The present disclosure, in some embodiments, relates to a method of transporting a semiconductor wafer. The method includes transferring a semiconductor wafer into a first wafer slot of a second plurality of wafer slots within an adaptive inset. The adaptive inset is arranged within an interior cavity of a wafer cassette having a first plurality of wafer slots while transferring the semiconductor wafer into the first wafer slot. The wafer cassette and the adaptive inset are transported into a loading port of a semiconductor processing tool configured to perform a fabrication process on the semiconductor wafer.

20 Claims, 7 Drawing Sheets

Related U.S. Application Data

(60) Provisional application No. 62/272,208, filed on Dec. 29, 2015.

(56) References Cited

U.S. PATENT DOCUMENTS

| | | | | |
|---|---|---|---|---|
| 2009/0003977 | A1* | 1/2009 | Aburatani | H01L 21/67742 |
| | | | | 414/217 |
| 2012/0001262 | A1* | 1/2012 | Kang | H01L 23/5386 |
| | | | | 257/368 |

FOREIGN PATENT DOCUMENTS

| | | | |
|---|---|---|---|
| CN | 104465463 | A | 3/2015 |
| JP | 7326657 | A | 12/1995 |
| TW | 200630280 | A | 9/2006 |
| TW | I276198 | B | 3/2007 |

OTHER PUBLICATIONS

Final Office Action dated Apr. 22, 2019 in connection with U.S. Appl. No. 15/288,155.
Notice of Allowance dated Sep. 18, 2019 in connection with U.S. Appl. No. 15/288,155.

* cited by examiner

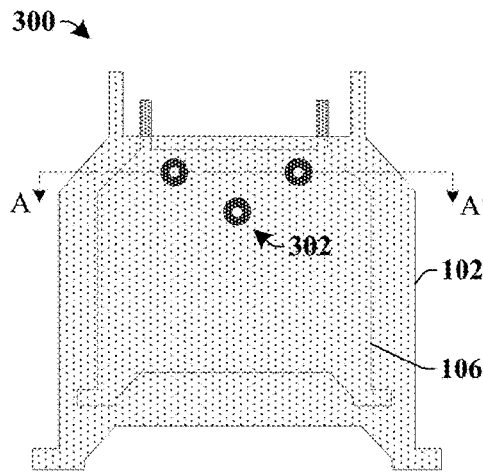 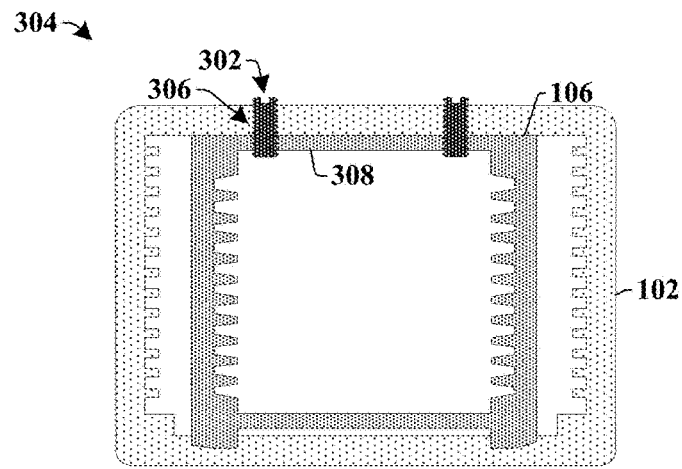
Fig. 3A          Fig. 3B
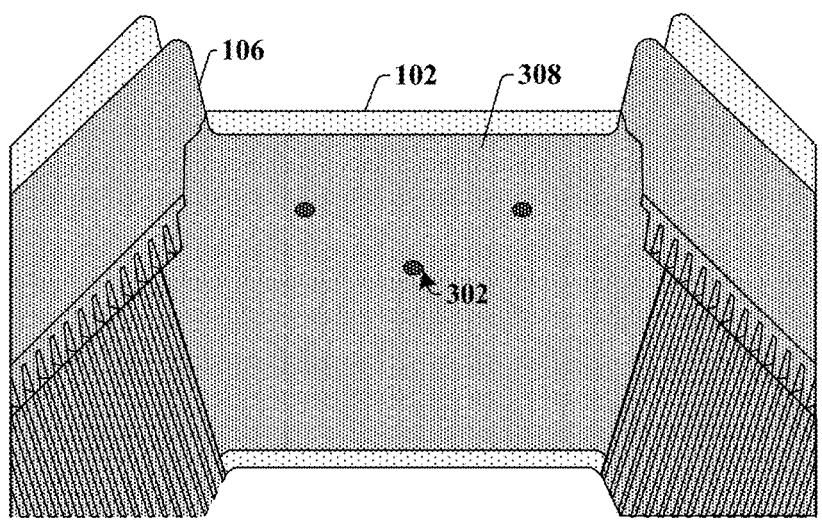
Fig. 3C

ADAPTIVE INSET FOR WAFER CASSETTE SYSTEM

REFERENCE TO RELATED APPLICATION

This application is a Continuation of U.S. patent application Ser. No. 15/288,155, filed on Oct. 7, 2016, which claims the benefit of U.S. Provisional Application No. 62/272,208, filed on Dec. 29, 2015. The contents of the above-referenced patent applications are hereby incorporated by reference in their entirety.

BACKGROUND

Integrated chips are fabricated in semiconductor fabrication facilities or fabs. Fabs contain processing tools that are configured to perform a plurality of processing steps (e.g., etching steps, lithography steps, deposition steps, etc.) upon a semiconductor wafer (e.g., a silicon wafer). To protect wafers from damage, wafers are generally transferred between different processing tools using wafer cassettes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrates some embodiments of a wafer cassette system having an adaptive inset fastened into a wafer cassette by a plurality of screws.

DETAILED DESCRIPTION

Figure 1A:
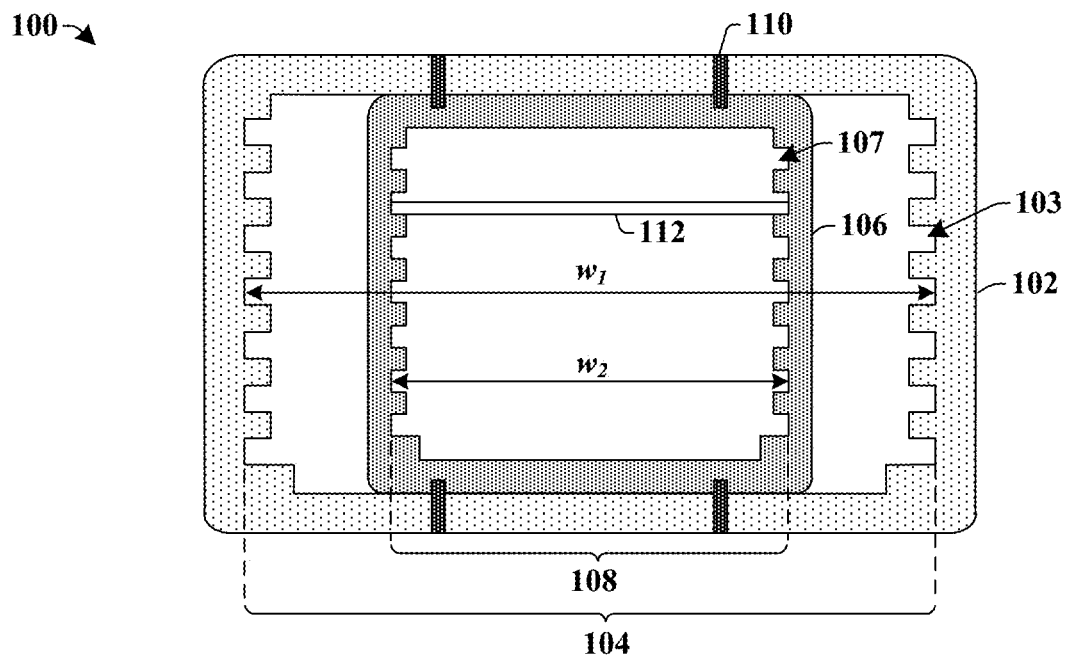
FIGS. 1A-1B illustrate some embodiments of a wafer cassette system having an adaptive inset configured to hold semiconductor wafers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, integrated chip processing tools within a fabrication facility are configured to receive semiconductor wafers held in a wafer cassette. However, some processing tools are not able to receive different sizes of wafer cassettes. For example, a processing tool may be able to receive a wafer cassette configured to hold 300 mm wafers, but not a wafer cassette configured to hold 200 mm wafers. Not being able to receive different wafer cassettes limits a processing tool's usefulness and requires different processing tools to be used for different diameter wafers, thereby increasing the cost of integrated chip fabrication.

The present disclosure relates to a wafer cassette system comprising an adaptive inset configured to enable semiconductor wafers having a first diameter to be held by a wafer cassette configured to hold semiconductor wafers having a second diameter that is larger than the first diameter. The wafer cassette system comprises a wafer cassette having a first plurality of wafer slots configured to receive one or more semiconductor wafers having a first diameter. An adaptive inset is arranged in an interior cavity of the wafer cassette. The adaptive inset comprises a second plurality of wafer slots configured to receive one or more semiconductor wafers having a second diameter that is less than the first diameter. The adaptive inset allows for the wafer cassette to hold semiconductor wafers having the second diameter, thereby enabling semiconductor processing tools to processes semiconductor wafer having a different diameter than those able to be held by wafer cassettes that the tools can receive.

Figure 1B:
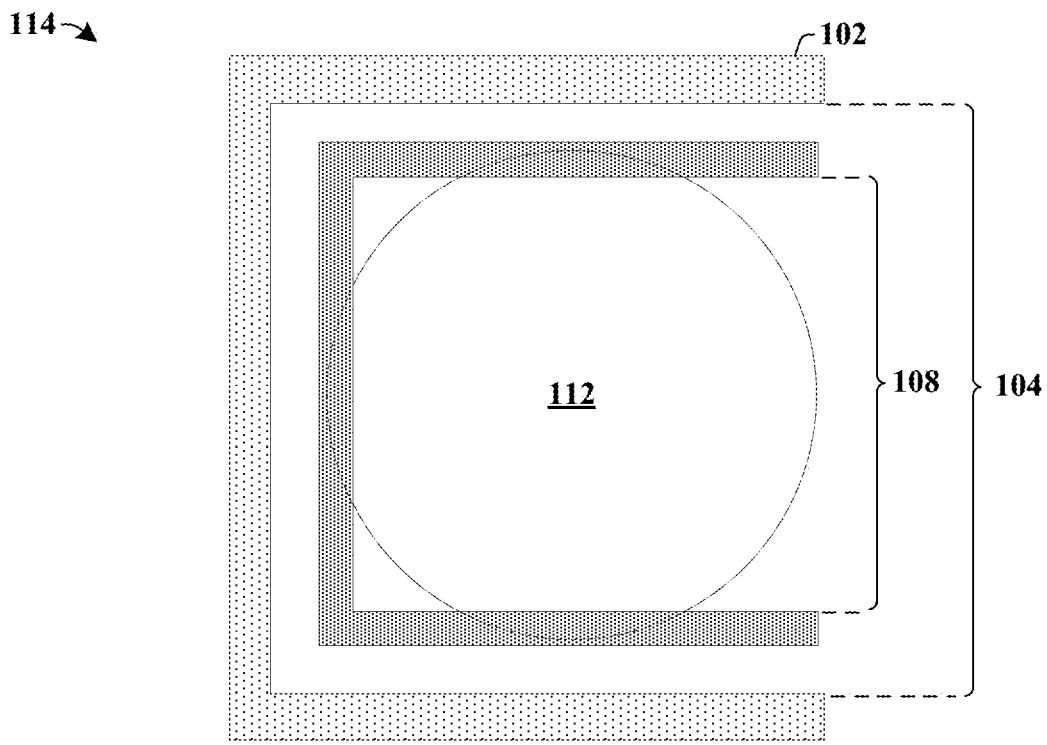

FIGS. 1A-1B illustrate some embodiments of a wafer cassette system having an adaptive inset configured to hold semiconductor wafers.

As shown in cross-sectional view 100, the wafer cassette system comprises a wafer cassette 102 having a first plurality of wafer slots 103 configured to hold a plurality of semiconductor wafers 112 having a first diameter. The wafer cassette 102 defines a first interior cavity 104 of the wafer cassette 102. As shown in top-view 114, the first interior cavity 104 is in communication with a first opening arranged along one side of the wafer cassette 102. The first interior cavity 104 has a first width $w_1$ that enables the wafer cassette 102 to receive the plurality of semiconductor wafers having the first diameter. For example, in some embodiments, a first width $w_1$ may be approximately 200 mm, so that the first plurality of wafer slots 103 are able to hold 200 mm wafers.

An adaptive inset 106 is arranged in the first interior cavity 104 of the wafer cassette 102. As shown in cross-sectional view 100, the adaptive inset 106 is connected to the wafer cassette 102 by way of one or more fastening elements 110 that provide for a rigid connection between the adaptive inset 106 and the wafer cassette 102. In some embodiments, the wafer cassette 102 and the adaptive inset 106 may comprise a same material.

The adaptive inset 106 has second interior cavity 108 with a second width $w_2$ that is less than the first width $w_1$. The second width $w_2$ of the second interior cavity 108 causes the adaptive inset 106 to have a second plurality of wafer slots 107 configured to hold a plurality of semiconductor wafers 112 having a second diameter that is less than the first diameter. For example, in some embodiments, the second width $w_2$ may be approximately 150 nm, so that the second plurality of wafer slots 107 are able to hold 150 mm wafers. As shown in top-view 114, the second interior cavity 108 is in communication with a second opening arranged along one side of the adaptive inset 106. The first opening and the second opening face the same direction.

The adaptive inset 106 is configured to adjust a diameter of a semiconductor wafer that the wafer cassette 102 is able to hold by adjusting a width of wafer slots configured to hold a semiconductor wafer. For example, the adaptive inset 106 allows for a wafer cassette 102 that is configured to hold a first wafer diameter (e.g., a 200 mm wafer), to hold a second wafer diameter (e.g., a 150 mm wafer). By adjusting a size of wafers that the wafer cassette 102 is able to hold, the adaptive inset 106 enables processing tools, which are configured to receive a single size of wafer cassette, to receive multiple sizes of wafers (e.g., wafers having a diameter that is different than that which the wafer cassette is configured to hold).

Figure 2A:
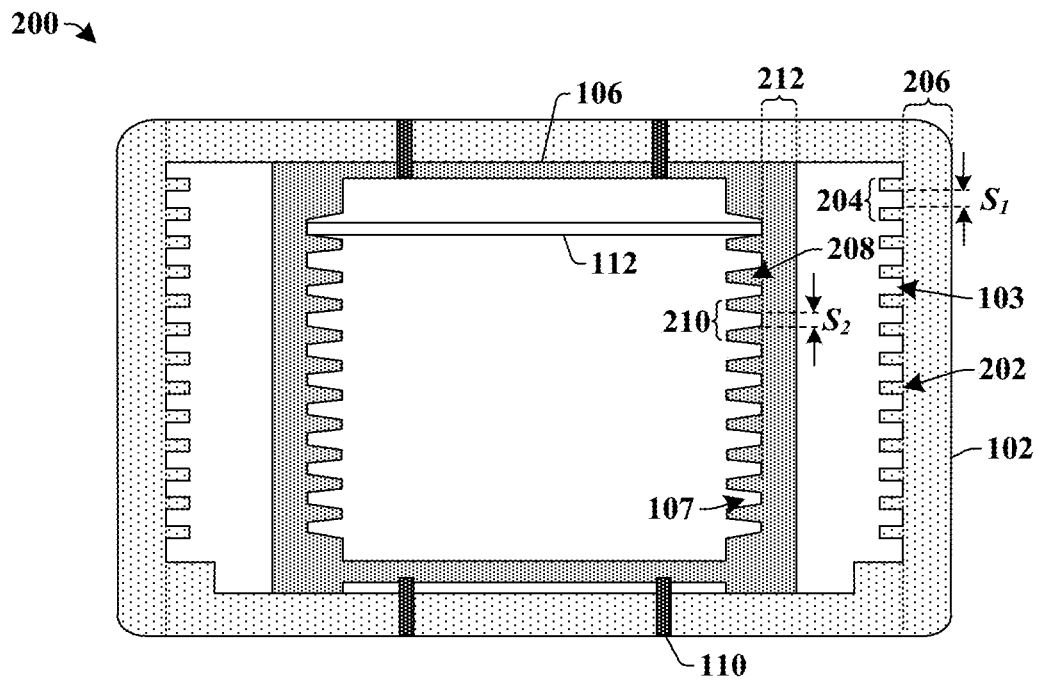
FIGS. 2A-2B illustrate some additional embodiments of a wafer cassette system having an adaptive inset configured to hold semiconductor wafers.
Figure 2B:
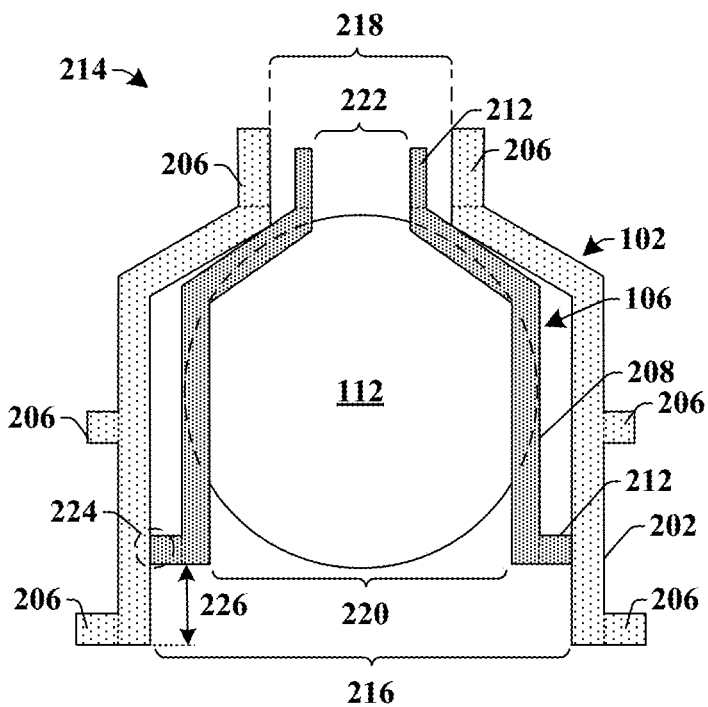

FIGS. 2A-2B illustrate some additional embodiments of a wafer cassette system 200 having an adaptive inset configured to hold a plurality of semiconductor wafers.

As shown in the cross-sectional view of FIG. 2A, the wafer cassette system 200 includes a wafer cassette 102. The wafer cassette 102 comprises a first plurality of wafer slots 103 arranged between a first plurality of separation ridges 202, and having a first size corresponding to a diameter of a wafer to be received by the wafer cassette 102. The first plurality of separation ridges 202 extend along a perimeter of the first plurality of wafer slots 103. Respective ones of the first plurality of wafer slots 103 are arranged between a first pair 204 of adjacent ones of the first plurality of separation ridges 202. The first plurality of separation ridges 202 are connected to one or more support bars 206 that vertically extend between upper and lower surfaces of the wafer cassette 102. Connecting the first plurality of separation ridges 202 to the one or more support bars 206 gives the first plurality of wafer slots 203 a constant spacing between adjacent ones of the first plurality of separation ridges 202.

An adaptive inset 106 is nested substantially within the wafer cassette 102. The adaptive inset 106 comprises a second plurality of wafer slots 107 arranged between a second plurality of separation ridges 208, and having a second size corresponding to a diameter of a wafer to be received by the adaptive inset 106. The second size is smaller than the first size. In some embodiments, the first plurality of separation ridges 202 may have different cross-sectional shapes than the second plurality of separation ridges 208. In other embodiments, the first plurality of separation ridges 202 and the second plurality of separation ridges 208 may have a same cross-sectional shape. Respective ones of the second plurality of wafer slots 107 are arranged between a second pair 210 of adjacent ones of the second plurality of separation ridges 208. In some embodiments, the first pair 204 of adjacent ones of the first plurality of separation ridges 202 are separated by a first space $S_1$ and the second pair 210 of adjacent ones of the second plurality of separation ridges 208 are separated by a second space $S_2$ that is smaller than the first space $S_1$.

The second plurality of separation ridges 208 extend along a perimeter of the second plurality of wafer slots 107. In some embodiments, the first plurality of wafer slots 103 are vertically offset from the second plurality of wafer slots 107. The second plurality of separation ridges 208 are connected to support bars 212 that vertically extend between upper and lower surfaces of the adaptive inset 106. Connecting the second plurality of separation ridges 208 to the one or more support bars 212 gives the second plurality of wafer slots 107 a constant spacing between adjacent ones of the second plurality of separation ridges 208. Since the adaptive inset 106 is nested substantially within the wafer cassette 102, second plurality of wafer slots 107 provide the wafer cassette 102 the ability to hold wafers corresponding to the second size.

The wafer cassette 102 is fastened to the adaptive inset 106 by way of one or more fastening elements 110. The fastening elements 110 are configured to hold the adaptive inset 106 at a fixed position with respect to the wafer cassette 102. In some embodiments, the one or more fastening elements 110 may comprise a screw, a pin, an adhesive (e.g., glue, epoxy, etc.), a solder, etc. In various embodiments, the one or more fastening elements 110 may be arranged along lower surface and/or upper exterior surface of the wafer cassette 102. In some embodiments, the one or more fastening elements 110 comprise a screw extending through surfaces of the wafer cassette 102 and the adaptive inset 106.

As illustrated in top-view 214 of FIG. 2B, the wafer cassette 102 comprises a first opening 216 arranged along a first of the wafer cassette 102 and having a width that extends between support bars 206 located on opposing sides of the first opening 216. In some embodiments, additional support bars may also be located at different positions around the first plurality of separation ridges 202. In some embodiments, the wafer cassette 102 may further comprise a second opening 218 arranged along a back-side of the wafer cassette 102. The second opening 218 has a smaller width than the first opening 216.

The adaptive inset 106 comprises a third opening 220 arranged along a front-side of the adaptive inset 106 and a forth opening 222 arranged along a back-side of the adaptive inset 106. The third opening 220 has a width that extends between support bars 212 of the adaptive inset 106. In some embodiments, the first opening 216 is arranged within a first side surface of the wafer cassette 102 and the second opening is arranged within a second side surface of the adaptive inset 106 that is laterally set back from the first side surface by a non-zero distance 226.

The wafer cassette 102 has one or more interior surfaces (e.g., sidewalls) contacting one or more exterior surfaces (e.g., sidewalls) of the adaptive inset 106 at one or more contact points 224. In some embodiments, one or more of the contact points 224 may be arranged along the first plurality of separation ridges 202 and the support bars 212 and/or along the second plurality of separation ridges 208 and the support bars 206.

FIGS. 3A-3C illustrates some embodiments of a wafer cassette system having an adaptive inset fastened into a wafer cassette by a plurality of screws.

As shown in top-view 300, an adaptive inset 106 is arranged in an interior cavity of a wafer cassette 102. One or more screws 302 are configured to fasten the adaptive inset 106 in a fixed relation to the wafer cassette 102. The one or more screws 302 are arranged along an upper surface of the wafer cassette 102. As shown in cross-sectional view 304 (taken along cross-sectional line A-A' of FIG. 3A), the one or more screws 302 extend through upper surfaces of the wafer cassette 102 and the adaptive inset 106. In some embodiments, the one or more screws 302 comprise a threaded exterior surface 306 that extends into the wafer cassette 102 and the adaptive inset 106. In some embodiments, the one or more screws 302 may protrude outward from a lower interior surface 308 of the adaptive inset 106.

In some embodiments, the one or more screws 302 may comprise a material that is able to undergo high temperatures without damage, such as stainless steel. In some embodiments, the one or more screws 302 may comprise vacuum screws, which respectively comprise a hole that extends from a top surface of a screw to a bottom of the screw to provide a path for trapped gases to be removed from the bottoms, sides, and shoulders of blind-tapped holes within the wafer cassette 102 and/or the adaptive inset 106, thereby allowing for an improved vacuum within a vacuum chamber. In some embodiments, the holes may extend along a central axis of the screw. In other embodiments, the holes may extend along an edge of the screw.

In various embodiments, the one or more screws 302 may comprise any number of screws. For example, in some embodiments, the one or more screws 302 may comprise three screws. In other embodiments, the one or more screws 302 may comprise more than three screws. In some embodiments, the one or more screws 302 are located at positions that are offset from a handle (not shown) arranged along the upper surface of the wafer cassette 102.

FIG. 3C illustrates a three-dimensional view 310 of the adaptive inset 106, which shows the one or more screws 302 exposed along the lower interior surface 308 of the adaptive inset 106.

Figure 4:
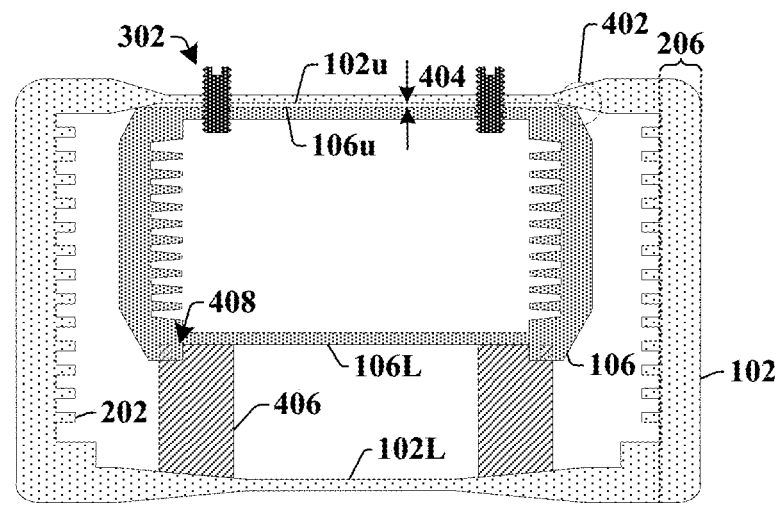
FIG. 4 illustrates a cross-sectional view of some embodiments of a wafer cassette system comprising an adaptive inset fastened into a wafer cassette by one or more support structures and one or more screws.

FIG. 4 illustrates a cross-sectional view of some embodiments of a wafer cassette system 400 comprising an adaptive inset fastened into a wafer cassette by one or more support structures and one or more screws.

The wafer cassette system 400 comprises an adaptive inset 106 arranged in an interior cavity of a wafer cassette 102. The adaptive inset 106 has an upper outer surface 106$u$ that contacts an upper interior surface 102$u$ of the wafer cassette 102 at one or more contact points 402. In some embodiments, the upper interior surface 102$u$ of the wafer cassette 102 may comprise an angled surface (i.e., a surface that is angled with respect to support bars 206 at an acute angle greater than zero). In some embodiments, the adaptive inset 106 may comprise one or more screws 302 that extend through upper surfaces of the wafer cassette 102 and the adaptive inset 106. In some embodiments, the one or more screws 302 may be positioned at a location that is laterally offset from the one or more contact points 402. This results in the one or more screws 302 extending through a gap 404 between the wafer cassette 102 and the adaptive inset 106.

The adaptive inset 106 also has a lower exterior surface 106L that contacts one or more support structures 406. The one or more support structures 406 are arranged between a lower interior surface 102L of the wafer cassette 102 and the lower exterior surface 106L of the adaptive inset 106. In some embodiments, the one or more support structures 406 may vertically extend from the lower interior surface 102L of the wafer cassette 102 past one or more of a first plurality of separation ridges 202 of the wafer cassette 102. The one or more support structures 406 comprise a rigid material that is configured to provide structural support to the adaptive inset 106, so that the adaptive inset 106 is rigidly fixed in the wafer cassette 102. In various embodiments, the one or more support structures 406 may comprise a plastic or a metal (e.g., stainless steel), for example. In some embodiments, the one or more support structures 406 may comprise blocks having a substantially square or rectangular cross-sectional shape.

In some embodiments, the lower exterior surface 106L of the adaptive inset 106 may comprise a ridge 408 that extends in a direction that intersects the one or more support structures 406. In such embodiments, the one or more support structures 406 may have a slot (i.e., depression) arranged within the upper surface of the support structures 406. The slot is configured to laterally and vertically contact the ridge 408, thereby providing for increased lateral support of the adaptive inset 106.

Figure 5A:
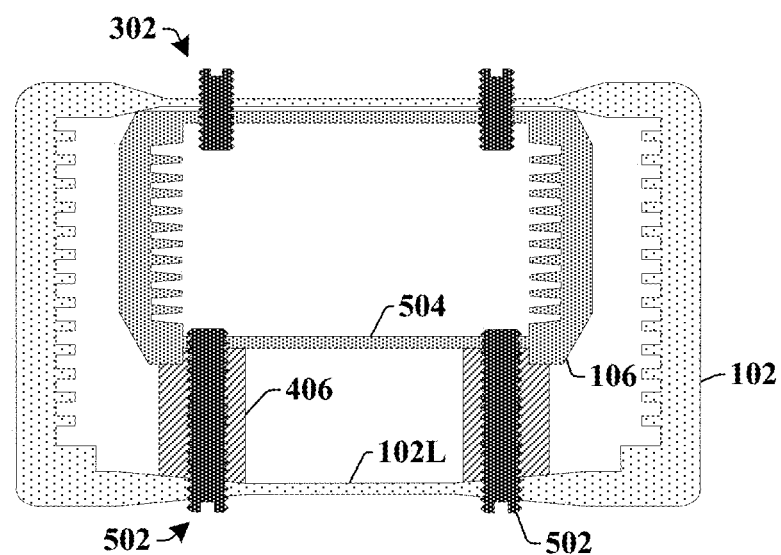
FIGS. 5A-5B illustrate some additional embodiments of a wafer cassette system comprising an adaptive inset fastened into a wafer cassette by support structures and screws.
Figure 5B:
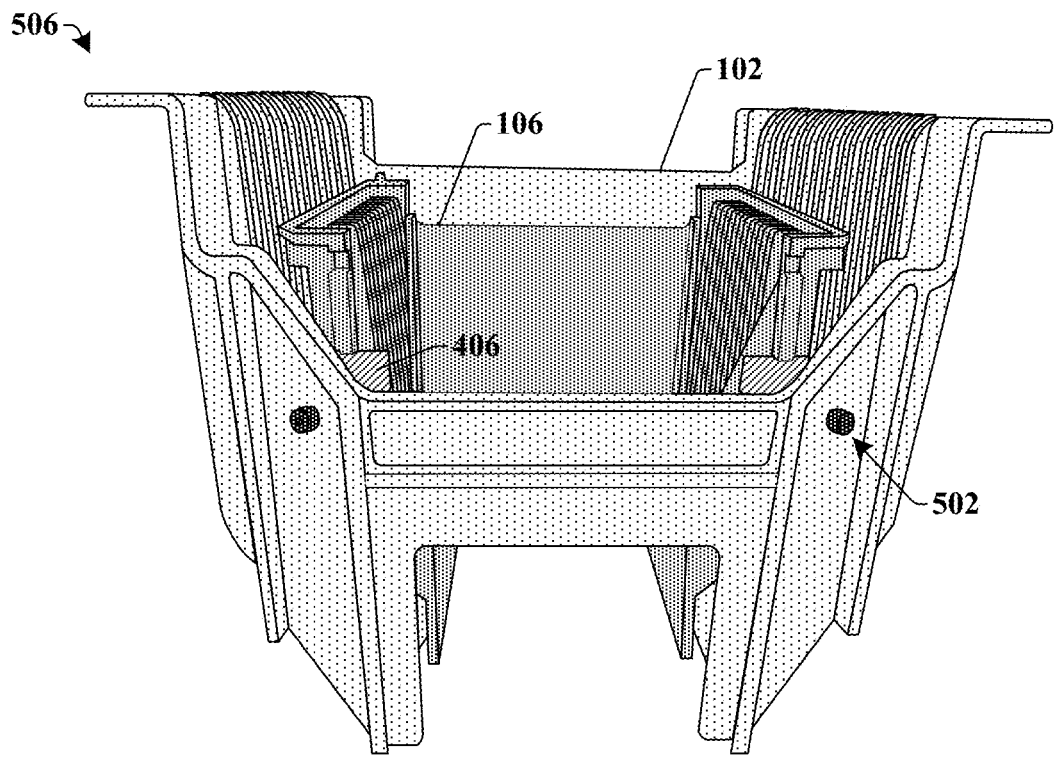

FIGS. 5A-5B illustrate some additional embodiments of a wafer cassette system comprising an adaptive inset fastened into a wafer cassette by support structures and screws.

As shown in cross-sectional view 500 of FIG. 5A and three-dimensional view 506 of FIG. 5B, a first group of one or more screws 302 extend through upper surfaces of a wafer cassette 102 and an adaptive inset 106. A second group of one or more screws 502 extend through the one or more support structures 406 and lower surfaces of the wafer cassette 102 and the adaptive inset 106. In some embodiments, the second group of one or more screws 502 may respectively comprise a vacuum screw having a hole surrounded by an outer rim. In some embodiments, the second group of one or more screws 502 may protrude outward from a lower interior surface 504 of the adaptive inset 106. The second group of one or more screws 502 are configured to hold the one or more support structures 406 and the adaptive inset 106 in place within an interior cavity of the wafer cassette 102.

Figure 6:
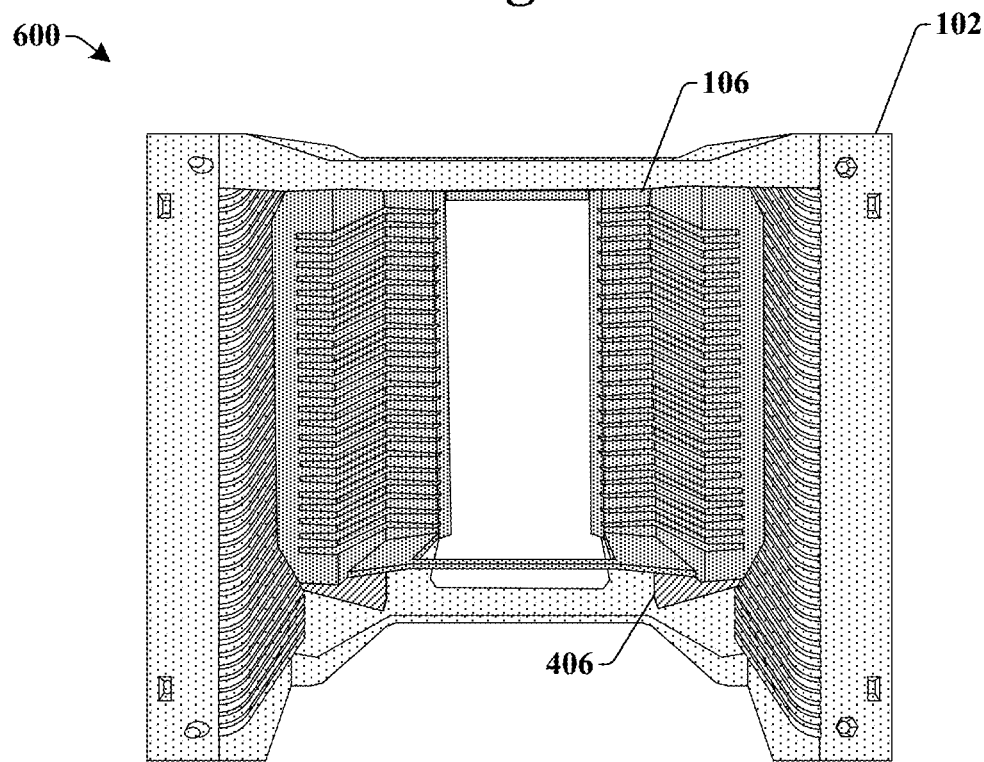
FIG. 6 illustrates a three-dimensional view of some embodiments of a wafer cassette system having an adaptive inset configured to hold semiconductor wafers.

FIG. 6 illustrates a three-dimensional view 600 of some embodiments of a wafer cassette system having an adaptive inset configured to hold semiconductor wafers. The three-dimensional view 600 illustrates some of the embodiments described above in relation to FIGS. 1A-5B.

Figure 7:
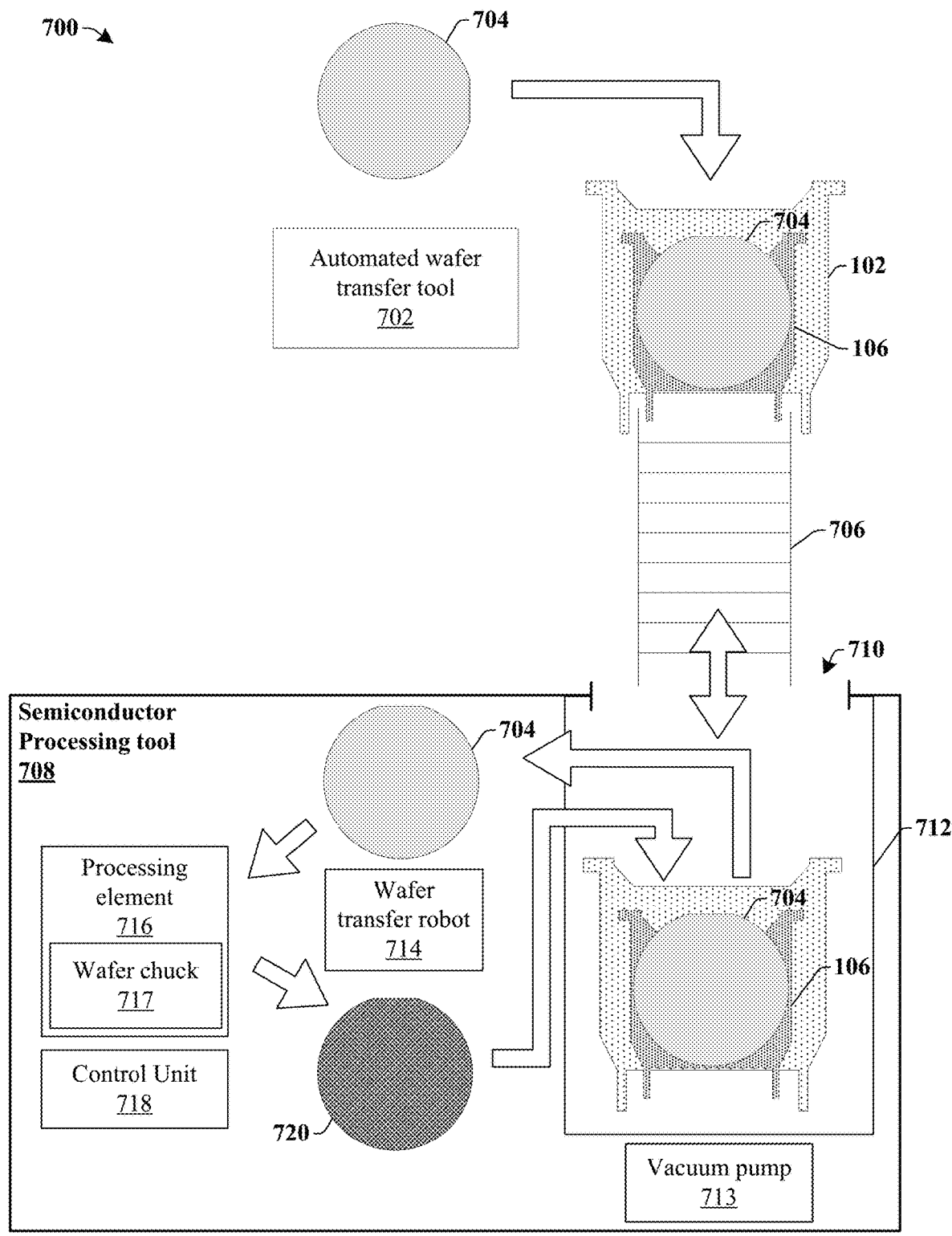
FIG. 7 a block diagram illustrating a semiconductor fabrication system configured to transfer semiconductor wafers using a wafer cassette system having an adaptive inset configured to hold a plurality of semiconductor wafers.

FIG. 7 illustrates some embodiments of a block diagram illustrating a semiconductor fabrication system 700 configured to transfer semiconductor wafers using a wafer cassette system having an adaptive inset configured to hold a plurality of semiconductor wafers.

The semiconductor fabrication system 700 comprises an automated wafer transfer tool 702 configured to transfer a semiconductor wafer 704 to one of a plurality of wafer slots within an adaptive inset 106 arranged in a wafer cassette 102. In some embodiments, the automated wafer transfer tool 702 may be configured to automatically transfer the semiconductor wafer 704 from a first processing tool to the adaptive inset 106. In other embodiments, the automated wafer transfer tool 702 may be configured to automatically transfer the semiconductor wafer 704 from a first wafer cassette to the adaptive inset 106. In some embodiments, the automated wafer transfer tool 702 may be able to transfer wafers having a larger diameter than the semiconductor wafer 704. For example, in some embodiments, the automated wafer transfer tool 702 may be able to transfer 200 mm wafers, while the semiconductor wafer 704 may be a 150 mm wafer.

The wafer cassette 102 and the adaptive inset 106 are transferred to an inlet 710 of a semiconductor processing tool 708. In some embodiments, the wafer cassette 102 may be transferred to the semiconductor processing tool 708 by way of a conveyer system 706. For example, in some embodiments, the wafer cassette 102 may be transported by overhead transport (OHT) vehicles that travel on rails. The OHT vehicles may be configured to raise the wafer cassette 102 of loading ports of a first tool, to laterally move the wafer cassette along the rails, and/or to lower the wafer cassette to the loading port of a tool.

The semiconductor processing tool 708 comprises a loading port 712 in communication with the conveyer system 706 and configured to receive the wafer cassette 102. In some embodiments, the loading port 712 is coupled to a vacuum pump 713 configured to generate a vacuum within the loading port 712. In some embodiments, the adaptive inset 106 has a first size (e.g., length, width, and/or depth) and the wafer cassette 102 has a second size (e.g., length, width, and/or depth) that is greater than the first size. In some embodiments, the loading port 712 is not able to receive a wafer cassette having the first size (i.e., the loading port 712 would not be able to receive a wafer cassette that is configured to hold the semiconductor wafer 704, but is able to receive the wafer cassette 102 having the adaptive inset 106 holding the semiconductor wafer 704). Therefore, in such embodiments, the adaptive inset allows for the semiconductor processing tool 708 to receive semiconductor wafers having a diameter that otherwise would not be able to be received.

A wafer transfer robot 714 is configured to remove the semiconductor wafer 704 from the wafer cassette 102 and to provide the semiconductor wafer 704 to a processing element 716 that is configured to perform a semiconductor process on the semiconductor wafer 704. In some embodiments, the wafer transfer robot 714 comprises a robot blade connected to the transfer arm at a connection point. For example, the robot blade may be configured to receive the semiconductor wafer 704 from the adaptive inset 106 and to hold the semiconductor wafer 704 as the transfer arm moves the robot blade from the adaptive inset 106 to the processing element 716, where the semiconductor wafer 704 is removed from the robot blade. In some embodiments, the semiconductor processing tool 708 may comprise a control unit 718 configured to coordinate operation of the wafer transfer robot 714 and the processing element 716.

In various embodiments, the processing element 716 may be configured to perform a semiconductor fabrication process (e.g., a deposition, an etch, a lithographic process, etc) on the semiconductor wafer 704. In some embodiments, the processing element 716 may comprise a self-assembled monolayer (SAM) deposition tool. The SAM deposition tool is configured to form a SAM on a surface of the semiconductor wafer 704 by way of one or more deposition processes. In some embodiments, the processing element 716 may comprise a wafer chuck 717 that has the ability to hold a wafer have a diameter that is greater than a diameter of plurality of the semiconductor wafer 704. For example, the wafer chuck 717 may have the ability to hold a 300 mm wafer, while the semiconductor wafer 704 may comprise a 200 mm wafer. The wafer chuck 717 is configured to hold the semiconductor wafer 704 while the semiconductor fabrication process is performed.

Once the processing element 716 has performed a semiconductor fabrication process on a wafer, the wafer transfer robot 714 is configured to transfer the processed wafer 720 from the processing element 716 to the adaptive inset 106 in the wafer cassette 102. Once processing on semiconductor wafers within the adaptive inset 106 is completed, the wafer cassette 102 is then removed from the loading port 712.

Figure 8:
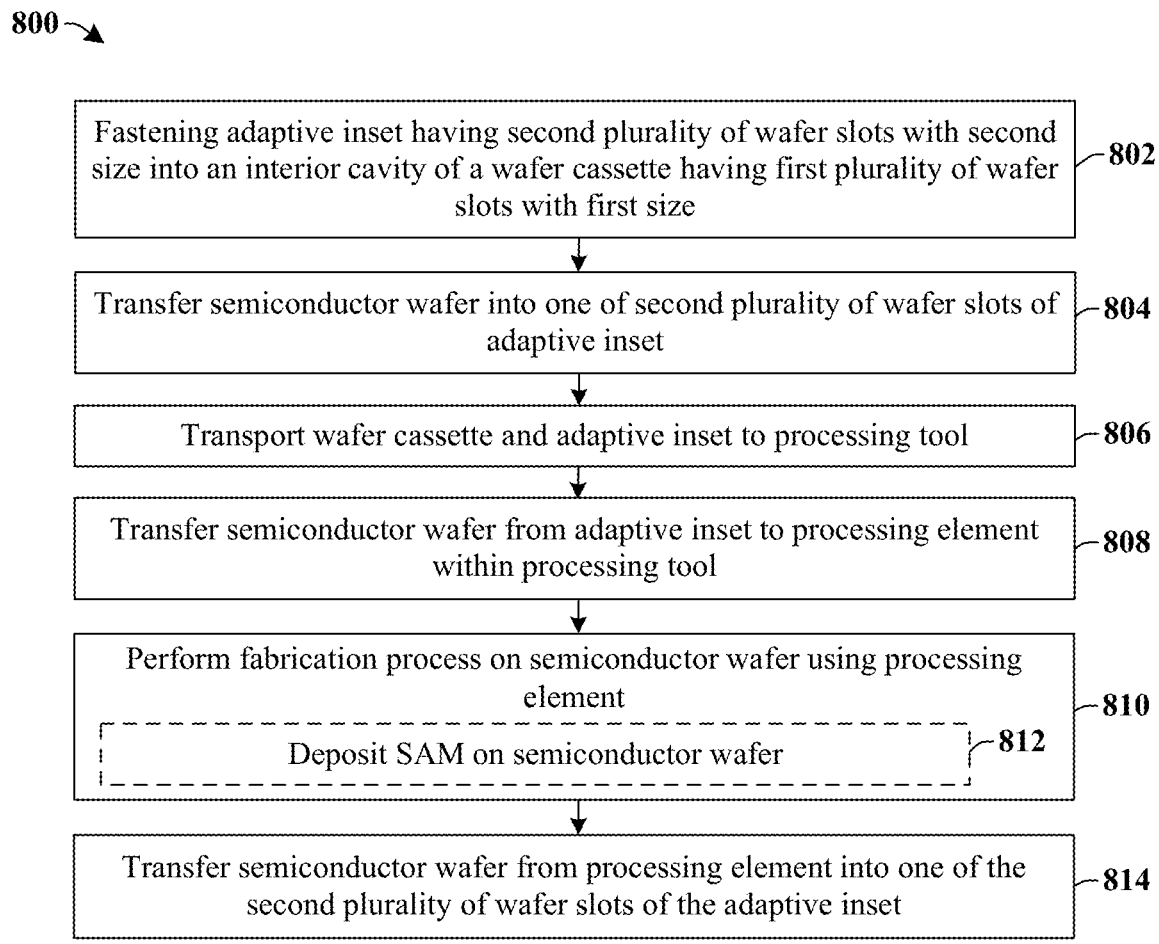
FIG. 8 illustrates a flow diagram of some embodiments of a method of semiconductor processing that transfers semiconductor wafers using a wafer cassette system having an adaptive inset configured to hold semiconductor wafers.

FIG. 8 illustrates a flow diagram of some embodiments of a method 800 of semiconductor processing that transfers semiconductor wafers using a wafer cassette system having an adaptive inset configured to hold semiconductor wafers.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 802, an adaptive inset having a second plurality of wafer slots with a second size is fastened into an interior cavity of a wafer cassette having a first plurality of wafer slots with a first size. The second size of the second plurality of wafer slots is smaller than the first size of the first plurality of wafer slots.

At 804, a semiconductor wafer is transferred into one of the second plurality of wafer slots of the adaptive inset. In some embodiment, the wafer may be transferred from a fabrication tool, or a wafer cassette having wafer slots with the second size, by an automated wafer transfer tool.

At 806, the wafer cassette and adaptive inset are transported to a semiconductor processing tool.

At 808, the semiconductor wafer is transferred from the adaptive inset to a processing element within the semiconductor processing tool.

At 810, a fabrication process is performed on the semiconductor wafer by the processing element. In some embodiments, the fabrication process may comprise forming a self-assembled monolayer on the semiconductor wafer, at 812.

At 814, the semiconductor wafer is transferred from the processing element into one of the second plurality of wafer slots of the adaptive inset.

Therefore, the present disclosure relates to a wafer cassette comprising an adaptive inset configured to enable semiconductor wafers having a first diameter to be held by a wafer cassette configured to hold semiconductor wafers having a second diameter that is larger than the first diameter.

In some embodiments, the present disclosure relates to a wafer cassette system. The wafer cassette system comprises a wafer cassette having a first plurality of wafer slots respectively configured to receive a semiconductor wafer having a first diameter. The wafer cassette system further comprises an adaptive inset arranged in an interior cavity of the wafer cassette and having a second plurality of wafer slots respectively configured to receive a semiconductor wafer having a second diameter that is smaller than the first diameter.

In other embodiments, the present disclosure relates to a wafer cassette system. The wafer cassette system comprises a wafer cassette comprising a first plurality of wafer slots respectively having a first width. The wafer cassette system further comprises an adaptive inset fastened to the wafer cassette in a rigid connection and having a second plurality of wafer slots respectively having a second width that is less than the first width.

In yet other embodiments, the present disclosure relates to a method of transporting semiconductor wafers. The method comprises transferring a semiconductor wafer into one of a second plurality of wafer slots within an adaptive inset arranged within an interior cavity of a wafer cassette having a first plurality of wafer slots. The method further comprises transporting the wafer cassette and the adaptive inset into a loading port of a semiconductor processing tool configured to perform a fabrication process on the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of transporting semiconductor wafers, comprising:
    transferring a semiconductor wafer into a first wafer slot of a second plurality of wafer slots within an adaptive inset, wherein the adaptive inset is arranged within an interior cavity of a wafer cassette having a first plurality of wafer slots while transferring the semiconductor wafer into the first wafer slot, and wherein a support structure continuously extends between a first surface of the support structure that faces an interior surface of the wafer cassette and an opposing second surface of the support structure that faces an exterior surface of the adaptive inset;
    transporting the wafer cassette and the adaptive inset into a loading port of a semiconductor processing tool configured to perform a fabrication process on the semiconductor wafer; and
    fastening the adaptive inset into the interior cavity of the wafer cassette prior to transferring the semiconductor wafer into the first wafer slot of the second plurality of wafer slots, wherein the adaptive inset is fastened to the wafer cassette by one or more fastening elements extending through the support structure.

2. The method of claim 1, wherein the support structure continuously extends past multiple ones of the first plurality of wafer slots.

3. The method of claim 1, further comprising:
    transferring the semiconductor wafer from the adaptive inset to a processing element within the semiconductor processing tool while the adaptive inset is within the wafer cassette.

4. The method of claim 1,
    wherein the first plurality of wafer slots are stacked in a first direction; and
    wherein the adaptive inset is inserted into the wafer cassette along a second direction that is perpendicular to the first direction.

5. The method of claim 1, wherein the transferring occurs while the adaptive inset is arranged within the wafer cassette and wherein there is a continuous opening extending through both the adaptive inset and wafer cassette whereby the semiconductor wafer travels into the first wafer slot.

6. The method of claim 1, wherein the adaptive inset is fastened to the wafer cassette by way of one or more screws.

7. The method of claim 1, wherein an opening extends along a line through the wafer cassette and the adaptive inset.

8. The method of claim 1, wherein the adaptive inset is a second wafer cassette configured to hold a smaller wafer than the wafer cassette.

9. The method of claim 1, wherein the first surface of the support structure contacts the interior surface of the wafer cassette and the opposing second surface of the support structure contacts the exterior surface of the adaptive inset.

10. A method of transporting semiconductor substrates, comprising:
    fastening an adaptive inset having a second plurality of substrate slots into an interior cavity of a cassette having a first plurality of substrate slots;
    transferring a semiconductor substrate into one of the second plurality of substrate slots of the adaptive inset while the adaptive inset is fastened into the interior cavity of the cassette; and
    transferring the semiconductor substrate out of the adaptive inset and into a semiconductor processing tool while the adaptive inset is fastened into the interior cavity of the cassette.

11. The method of claim 10, wherein the first plurality of substrate slots are defined by a plurality of separation ridges that contact an outermost exterior surface of the adaptive inset.

12. The method of claim 10, wherein a substrate transfer robot is configured to transfer the semiconductor substrate from the adaptive inset to the semiconductor processing tool.

13. The method of claim 10, wherein the adaptive inset is fastened to the cassette by way of one or more screws extending through one or more support structures, the one or more support structures arranged directly between an exterior surface of the adaptive inset and an interior surface of the cassette.

14. The method of claim 13, wherein the one or more screws continuously extend through opposing outer surfaces of the one or more support structures.

15. The method of claim 10, wherein an opening extends through the cassette and the adaptive inset after the adaptive inset has been fastened to the cassette, the opening configured to receive the semiconductor substrate.

16. The method of claim 15, wherein the opening has a first width that is larger than a second width of the semiconductor substrate.

17. A method of transporting semiconductor substrates, comprising:
    transferring a semiconductor substrate into one of a second plurality of substrate slots within an adaptive inset that is fastened to a cassette, wherein the cassette has a first plurality of substrate slots with a first size that is larger than a second size of the second plurality of substrate slots and wherein the first plurality of substrate slots are defined by a plurality of ridges that contact an outermost exterior surface of the adaptive inset; and
    transporting the semiconductor substrate within both the cassette and the adaptive inset.

18. The method of claim 17, further comprising:
    transferring the semiconductor substrate through a common opening extending through both the adaptive inset and cassette.

19. The method of claim 17, wherein the semiconductor substrate is separated from the second plurality of substrate slots by a non-zero distance.

20. The method of claim 17,
wherein the plurality of ridges extend along a first direction and along a second direction perpendicular to the first direction; and
wherein one or more of the first plurality of substrate slots are arranged between an end of the adaptive inset and an interior surface of the cassette along a third direction that is perpendicular to the first direction and the second direction.

* * * * *